United States Patent
Suljic et al.

(10) Patent No.: US 11,677,259 B2
(45) Date of Patent: *Jun. 13, 2023

(54) POWER BACKUP ARCHITECTURE USING CAPACITOR

(71) Applicant: Micron Technology, Inc., Boise, ID (US)

(72) Inventors: Vehid Suljic, Meridian, ID (US); Matthew D. Rowley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/534,168

(22) Filed: Nov. 23, 2021

(65) Prior Publication Data

US 2022/0085645 A1 Mar. 17, 2022

Related U.S. Application Data

(63) Continuation of application No. 16/525,231, filed on Jul. 29, 2019, now Pat. No. 11,218,019.

(51) Int. Cl.
*H02J 7/34* (2006.01)
*H02J 9/06* (2006.01)
(Continued)

(52) U.S. Cl.
CPC ............ *H02J 7/345* (2013.01); *G06F 3/0625* (2013.01); *H02J 7/0018* (2013.01); *H02J 9/061* (2013.01);
(Continued)

(58) Field of Classification Search
CPC .......... H02J 7/345; H02J 7/0018; H02J 9/061; G06F 3/0625; G06F 13/28; G01R 27/28;
(Continued)

(56) References Cited

U.S. PATENT DOCUMENTS 5,023,556 A 6/1991 Miller
5,517,634 A 5/1996 Ehrlich
(Continued)

FOREIGN PATENT DOCUMENTS

WO WO-2013192167 A1 12/2013
WO WO-2021021569 A1 2/2021
WO WO-2021021570 A1 2/2021

OTHER PUBLICATIONS

U.S. Appl. No. 16/524,933, filed Jul. 29, 2019, Power Backup Architecture to Manage Capacitor Health.
(Continued)

*Primary Examiner* — Phallaka Kik
(74) *Attorney, Agent, or Firm* — Schwegman Lundberg & Woessner, P.A.

(57) ABSTRACT

Various embodiments described herein use a set of capacitor sets (e.g., capacitor banks) in a power backup architecture for a memory sub-system, where each capacitor set can be individually checked for a health condition (e.g., in parallel) to determine their respective health after the memory sub-system has completed a boot process. In response to determining that at least one capacitor set has failed the health condition (or a certain number of capacitor sets have failed the health condition), the memory sub-system can perform certain operations prior to primary power loss to the memory sub-system (e.g., preemptively performs a data backup process to ensure data integrity) and can adjust the operational mode of the memory sub-system (e.g., switch it from read-write mode to read-only mode).

20 Claims, 9 Drawing Sheets

(51) Int. Cl.
  *H02J 7/18* (2006.01)
  *G06F 3/06* (2006.01)
  *G06F 13/28* (2006.01)
  *G01R 27/28* (2006.01)
  *G01R 31/14* (2006.01)
  *H01M 10/52* (2006.01)
  *H01M 10/46* (2006.01)
  *H01M 10/48* (2006.01)
  *H02J 7/00* (2006.01)

(52) U.S. Cl.
  CPC .............. *G01R 27/28* (2013.01); *G01R 31/14* (2013.01); *G06F 13/28* (2013.01); *H01M 10/46* (2013.01); *H01M 10/48* (2013.01); *H01M 10/52* (2013.01)

(58) Field of Classification Search
  CPC ...... G01R 31/14; H01M 10/48; H01M 10/46; H01M 10/52
  USPC ............ 320/166; 710/170; 702/119; 711/170
  See application file for complete search history.

(56) References Cited

U.S. PATENT DOCUMENTS

| | | | |
|---|---|---|---|
| 5,579,257 | A | 11/1996 | Tai |
| 6,075,378 | A | 6/2000 | Okamura |
| 6,348,806 | B1 | 2/2002 | Okandan et al. |
| 6,580,279 | B1 | 6/2003 | Baumgartner et al. |
| 7,953,709 | B2 | 5/2011 | Akidau et al. |
| 10,126,806 | B2 | 11/2018 | Chiasson et al. |
| 11,218,019 | B2 * | 1/2022 | Suljic .................. H02J 7/0018 |
| 11,226,920 | B2 * | 1/2022 | Johnson ................ G06F 15/167 |
| 11,409,348 | B2 | 8/2022 | Suljic et al. |
| 2009/0226007 | A1 | 9/2009 | Nagashima |
| 2009/0248756 | A1 | 10/2009 | Akidau et al. |
| 2010/0052625 | A1 | 3/2010 | Cagno et al. |
| 2010/0202240 | A1 | 8/2010 | Moshayedi et al. |
| 2011/0185211 | A1 * | 7/2011 | Chiasson .................. G06F 1/30 714/48 |
| 2011/0215654 | A1 | 9/2011 | Kumar et al. |
| 2011/0291984 | A1 | 12/2011 | Chang et al. |
| 2013/0057294 | A1 | 3/2013 | Mizoguchi et al. |
| 2014/0029346 | A1 | 1/2014 | Tanzawa et al. |
| 2014/0266416 | A1 | 9/2014 | Dally et al. |
| 2015/0268709 | A1 | 9/2015 | Morning-smith et al. |
| 2015/0268873 | A1 | 9/2015 | Gibbons et al. |
| 2015/0318027 | A1 | 11/2015 | Ellis et al. |
| 2016/0274637 | A1 | 9/2016 | Kang |
| 2018/0059761 | A1 | 3/2018 | An et al. |
| 2018/0102157 | A1 | 4/2018 | Bedeschi et al. |
| 2018/0113499 | A1 | 4/2018 | Fernandes |
| 2018/0364776 | A1 | 12/2018 | Kao et al. |
| 2019/0121560 | A1 | 4/2019 | Keeth et al. |
| 2019/0377644 | A1 | 12/2019 | Kulkarni et al. |
| 2020/0091739 | A1 | 3/2020 | Wagoner et al. |
| 2021/0034128 | A1 | 2/2021 | Suljic et al. |
| 2021/0036540 | A1 | 2/2021 | Suljic et al. |
| 2021/0089385 | A1 | 3/2021 | Basuta et al. |

OTHER PUBLICATIONS

U.S. Appl. No. 16/525,231, filed Jul. 29, 2019, Power Backup Architecture Using Capacitor.
U.S. Appl. No. 16/525,231 U.S. Pat. No. 11,218,019, filed Jul. 29, 2019, Power Backup Architecture Using Capacitor.
U.S. Appl. No. 16/524,933, Response filed Jan. 18, 2022 to Final Office Action dated Nov. 18, 2021, 14 pgs.
U.S. Appl. No. 16/524,933, Advisory Action dated Feb. 9, 2022, 4 pgs.
U.S. Appl. No. 16/524,933, Response filed Feb. 18, 2022 to Advisory Action dated Feb. 9, 2022, 16 pgs.
U.S. Appl. No. 16/524,933, Notice of Allowance dated Apr. 5, 2022, 18 pgs.
"International Application Serial No. PCT/US2020/043292, International Preliminary Report on Patentability dated Feb. 10, 2022", 10 pgs.
"International Application Serial No. PCT/US2020/043296, International Preliminary Report on Patentability dated Feb. 10, 2022", 7 pgs.
"International Application Serial No. PCT/US2020/043292, International Search Report dated Oct. 30, 2020", 3 pgs.
"International Application Serial No. PCT/US2020/043292, Written Opinion dated Oct. 30, 2020", 8 pgs.
"International Application Serial No. PCT/US2020/043296, International Search Report dated Oct. 26, 2020", 3 pgs.
"International Application Serial No. PCT/US2020/043296, Written Opinion dated Oct. 26, 2020", 5 pgs.

* cited by examiner

POWER BACKUP ARCHITECTURE USING CAPACITOR

PRIORITY APPLICATION

This application is a continuation of U.S. application Ser. No. 16/525,231, filed Jul. 29, 2019, which is incorporated herein by reference in its entirety.

TECHNICAL FIELD

Embodiments of the disclosure relate generally to power backup and more specifically, relate to power backup architecture using a capacitor as a backup power source for an electronic system, such as a memory sub-system.

BACKGROUND

A memory sub-system can be a storage device, a memory module, or a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
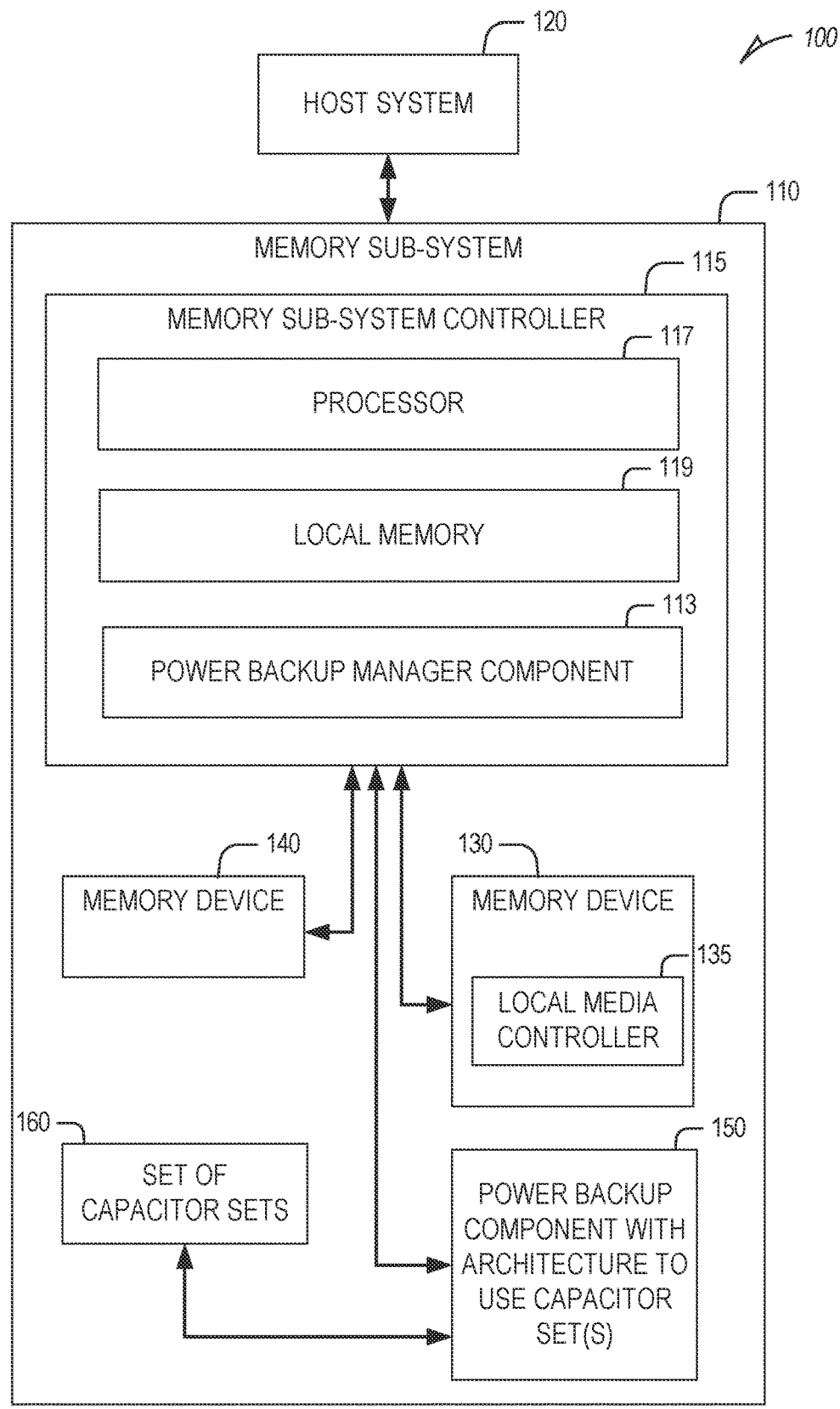
FIG. 1 illustrates an example computing environment that includes a memory sub-system, in accordance with some embodiments of the present disclosure.

Aspects of the present disclosure are directed to a power backup architecture that uses one or more capacitors as a backup power source, which may be used by or part of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components (also hereinafter referred to as "memory devices"). The host system can provide data to be stored at the memory sub-system and can request data to be retrieved from the memory sub-system.

Electronic systems often use a power backup architecture that includes a grouping of capacitors (e.g., high-voltage capacitors), such as a capacitor bank that includes two or more capacitors. For example, a memory component or a memory sub-system can use such a power backup architecture to ensure data integrity (e.g., data write commands sent to the memory sub-system by a host system are performed) when the memory component/memory sub-system loses power from its primary power source; the power backup architecture can ensure that data in-flight or stored on non-persistent memory is stored to persistent memory of the memory component/memory sub-system in the event primary power failure/loss.

Some traditional memory sub-systems that use the aforementioned power backup architecture boot (e.g., via a boot process) while simultaneously charging one or more of the capacitors used as backup power; if one of the capacitors is determined to be shorted or failed while the capacitors are being charged, a power backup controller of the traditional memory sub-system can prevent the traditional memory sub-system from ever completely booting (e.g., completing a boot process). Unfortunately, this ends up preventing a user of the traditional memory subsystem from subsequently accessing their data (e.g., user data) stored on the traditional memory sub-system after a shorted/failed capacitor is detected. Since the traditional memory sub-system would be prevented from booting up until the shorted/failed capacitor(s) are repaired or replaced, typically the user would have to resort to sending the traditional memory sub-system to the manufacturer of the memory sub-system (e.g., as part of a return merchandise authorization (RMA) process) so that the manufacturer can recover the user's data from the memory sub-system on behalf of the user.

Aspects of the present disclosure address the above and other deficiencies by having a memory sub-system that completes a boot process prior to (e.g., a power backup controller) determining health of one or more capacitor sets that provide backup power for the memory sub-system and charging the one or more capacitor sets (to prepare the one or more capacitor sets to provide backup power). By completing the boot process in this manner, the memory sub-system can provide (e.g., via the boot process) a user with read-only or read-write only access to data on the memory sub-system even if one or more of the capacitor sets are determined to fail a health condition (e.g., capacitor set is shorted or exhibiting deteriorating health). A capacitor set can refer to a grouping of one or more capacitors, such as a capacitor bank.

By use of various embodiments described herein, a memory sub-system can provide a user with access (e.g., read-only or read-write access) to data stored on the memory sub-system regardless of the health of one or more capacitors providing backup power for the memory sub-system. In this way, where a memory sub-system includes one or more capacitor sets that fail a health condition and render backup power for the memory sub-system unavailable, a user can readily access data stored on the memory sub-system without additional effort, such as returning the memory sub-system to the manufacturer to recover the user's data.

As used herein, a capacitor set can refer to a grouping of one or more capacitors. For instance, a single capacitor set can include a capacitor bank. For some embodiments, the capacitor set includes two or more capacitors of a similar capacitance rating, where the two or more capacitors are arranged in series, in parallel, or some combination thereof. Each capacitor can include a high-voltage capacitor suitable for providing backup power to an electronic system.

Disclosed herein are some examples of systems that include or use a power backup architecture using a capacitor as a backup power source for a memory sub-system, as described herein.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or inure memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

An example of non-volatile memory devices (e.g., memory device 130) includes a negative-and (NAND) type flash memory. Each of the memory devices 130 can include one or more arrays of memory cells such as single level cells (SLCs) or multi-level cells (MLCs) (e.g., triple level cells (TLCs) or quad-level cells (QLCs)). In some embodiments, a particular memory component can include an SLC portion, and an MLC portion, a TLC portion, or a QLC portion of memory cells. Each of the memory cells can store one or more bits of data used by the host system 120. Furthermore, the memory cells of the memory devices 130 can be, grouped as memory pages or memory blocks that can refer to a unit of the memory component used to store data.

Although non-volatile memory components such as NAND type flash memory are described, the memory device 130 can be based on any other type of non-volatile memory, such as read-only memory (ROM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130.

As shown, the memory sub-system 110 includes a power backup component 150 with architecture to use one or more capacitor sets, and a set of capacitor sets 160 (hereafter, capacitor sets 160) operatively coupled to the power backup component 150. For some embodiments, the plurality of capacitor sets 160 provide or assist in providing backup power to the memory sub-system 110 in the event of primary power loss to the memory sub-system 110. The number of capacitors per each of the capacitor set 160 can depend on design of the power backup architecture or the power needs of the memory sub-system 110 during a primary power failure/loss to the memory sub-system 110.

After a boot process of the memory sub-system 110 has completed, the power backup component 150 can determine (e.g., cheek) whether each capacitor set individually satisfies a health condition to check their respective health. These determinations (e.g., health checks) of individual capacitor sets can be performed in parallel for one or more of the individual capacitor sets. After the initial determination (e.g., health check) of each of the capacitor sets 160, the power backup component 150 can charge the set of capacitor sets 160 based on the initial determination of whether each of the capacitor sets 160 satisfies the health condition. For instance, in response to the power backup component 150 determining that all capacitor set satisfy the health condition (or that the number of capacitor sets failing to satisfy the health condition does not transgress a threshold number), the power backup component 150 can cause those capacitor sets in the capacitor sets 160 that pass the health condition to charge (e.g., to a desired charge level). Those capacitor sets in the capacitor sets 160 that do not pass the health condition can be isolated and prevented from charging, and can be isolated and prevented from being used by the power backup component 150 when the memory sub-system 110 suffers loss or failure of primary power (via the primary power interface). Further, in response to the power backup component 150 determining that all capacitor set satisfy the health condition (or that the number of capacitor sets failing to satisfy the health condition does not transgress the threshold number), the power backup component 150 can cause the memory sub-system 110 (e.g., via a signal to the memory sub-system controller 115) to switch to read-write mode if the completed boot process started the memory sub-system 110 in read-only mode.

Alternatively, in response to the power backup component 150 determining that at least one the capacitor sets 160 fails to satisfy the health condition (or that the number of capacitor sets failing to satisfy the health condition transgresses a threshold number), the power backup component 150 can cause the memory sub-system controller 115 to perform a data backup process (as described herein). Additionally, in response to the power backup component 150 determining that at least one the capacitor sets 160 fails to satisfy the health condition (or that the number of capacitor sets failing to satisfy the health condition transgresses a threshold number), the power backup component 150 can cause the memory sub-system 110 (e.g., via a signal to the memory sub-system controller 115) to switch to read-only mode (or remain in read-only mode if the memory sub-system 110 the boot up process enables the memory sub-system 110 with read-only mode by default). By switching the memory sub-system 110 to read-only mode, the host system 120 can be informed that the memory sub-system 110 is no longer accepting data write commands from the host system 120, thereby avoiding any subsequent data integrity issues (e.g., data from the host failing to get persistently stored on a memory component of the memory sub-system). Additionally, by switching the memory sub-system 110 to read-only mode, while the memory sub-system 110 continues to be powered by an external power source (e.g., the host system 120), the host system 120 can read data already stored on the memory sub-system 110 and do so despite the set of capacitor sets 160 being unreliable/unavailable as a backup power source. This can also obviate the need for the memory sub-system 110 to be first repaired or returned to a memory sub-system manufacturer for data recovery in the event the set of capacitor sets 160 becomes unreliable/unavailable.

Additionally, after the initial determination (e.g., health check) of the individual capacitor sets, the power backup component 150 can continue to keep re-determining (e.g., rechecking) whether individual capacitor sets satisfy the heath condition, and these re-determinations (e.g., re-checks) can be performed periodically (e.g., every 30 minutes). Further, concurrent with the health determination/re-determinations, the power backup component 150 can periodically determine whether the memory sub-system 110 has stopped receiving primary power via a primary power interface of the memory sub-system 110. Though not shown, a primary power interface of the memory sub-system 110 can receive power from a power source external to the memory sub-system, such as from the host system 120.

A health condition for a given capacitor set can be defined such that the health condition can determine, for example, whether the given capacitor set is experiencing failure (e.g., the given capacitor set is shorted) or is experiencing health that is unfavorable for power backup purposes (e.g., the given capacitor set is unable to hold an acceptable charge). Depending on the embodiment, determining whether a given capacitor set satisfies a health condition can include performing a test process that charges on the given capacitor set (e.g., loads a certain charge level on the capacitor set) and then measures how fast the given capacitor set discharges (e.g., fast or steep discharge rate can indicate that the given capacitor set is unhealthy or unreliable for power backup purposes). Where this determination is performed repeatedly (e.g., periodically), the results of the test process can be stored for future reference/comparison, such as to determine whether the rate at which the discharge rate is changing over time (with repeated tests) indicates imminent failure of the given capacitor set.

Depending on the embodiment, a data backup process can cause any data still pending persistent storage on a memory device 130, 140 of the memory sub-system 110 to be persistently stored on the memory device. Such data can include, for example, data "in flight" to the memory sub-system from a host system, which may be stored on a cache of the memory sub-system but has yet to be committed to a memory component of the memory sub-system.

An embodiment described herein can use a threshold number with respect to failed capacitor sets where the set of capacitor sets 160 is designed to include one or more extra or redundant capacitor sets (e.g., in view of the power backup needs of the memory sub-system). The use of extra or redundant capacitor sets can permit a memory sub-system 110 to safely switch from read-only mode to read-write mode (e.g., normal operation mode) after the boot process is completed when a certain number of capacitor sets failing to satisfy the health condition does not transgress a threshold number (e.g., certain number less than the threshold number). During normal operation mode, use of extra or redundant capacitor sets in the set of capacitor sets 160 can permit a memory sub-system 110 to continue to operate in read-write mode as long as less than the threshold number of failed capacitor sets is detected.

During the periodic determination of each of the capacitor sets 160 individually satisfies the health condition, if the power backup component 150 determines that at least one capacitor set fails to satisfy the health condition (or that the number of capacitor sets failing to satisfy the health condition transgresses a threshold number), the power backup component 150 can cause the memory sub-system controller 115 to perform a data backup process (as described herein). The power backup component 150 can (e.g., subsequently) cause the memory sub-system 110 (e.g., via a signal to the memory sub-system controller 115) to switch from read-write mode to read-only mode.

During the periodic determination with respect to loss of primary power to the memory sub-system 110, if the power backup component 150 determines that the memory sub-system 110 stops receiving primary power (e.g., from the host system 120), the power backup component 150 can cause power to the memory sub-system 110 (e.g., the memory sub-system controller 115 or one of the memory devices 130, 140) to switch from a primary power source (via the primary power interface) to the set of capacitor sets 160. In particular, this can involve the power backup component 150 switching the memory sub-system controller 115 from being powered by the primary power interface to being powered by the set of capacitor sets 160. In doing so, the memory sub-system 110 can be isolated from the power rail and a hardware power connector of the memory sub-system that couples to the host system 120. At this point, the memory sub-system 110 can be considered to be in power failure mode. Additionally, the power backup component 150 can transmit a signal to the memory sub-system controller 115 that indicates to the memory sub-system 110 that a power failure event has occurred.

Additionally, during the periodic determination with respect to loss of primary power to the memory sub-system 110, if the power backup component 150 determines that the memory sub-system 110 stops receiving primary power (e.g., from the host system 120), the power backup component 150 can respond by causing the memory sub-system controller 115 to perform a data backup process as described herein. For instance, the data backup process can cause all data, in-flight from the host system (e.g., 120) to the memory sub-system (e.g., 110) not yet stored to persistent storage of the memory sub-system, to be stored (e.g., on one or more the memory device 130 or 140.

For some embodiments, the boot process of the memory sub-system 110 is performed, or at least initiated, by the memory sub-system controller 115. Further, for some embodiments, the boot process of the memory sub-system 110 enables the host system 120 to access data (e.g., user data) stored on one or more of the memory devices 130, 140 of the memory sub-system 110. Depending on the embodiment, the access enabled can include read-write access or read-only access. For instance, initially the boot process at power up allows the memory sub-system 110 to boot up in read-only mode, and the memory sub-system 110 (e.g., via a power backup manager component 113) can switch from read-only access to read-write access in response to the power backup component 150 informing (e.g., signaling) the memory sub-system controller 115 that each of the capacitor sets 160 satisfies a health condition (or that the number of capacitor sets failing to satisfy the health condition does not transgress a threshold number). Alternatively, the memory sub-system 110 (e.g., via a power backup manager component 113) can switch from read-only access to read-write access in response to the power backup component 150 informing (e.g., signaling) the memory sub-system controller 115 that those capacitor sets in the capacitor sets 160 that pass the health condition are sufficiently charged (e.g., charged to a desired charge level).

The memory sub-system 110 includes a power backup manager component 113 that can implement one or more aspects of some embodiments with respect to the memory sub-system controller 115. In some embodiments, the memory sub-system controller 115 includes at least a portion of the power backup manager component 113. For example, the memory sub-system controller 115 can include a processor 117 (processing device) configured to execute instructions stored in local memory 119 for performing the operations described herein. In some embodiments, the power backup manager component 113 is part of the host system 110, an application, or an operating system.

The power backup manager component 113 can cause the memory sub-system 110 (via the memory sub-system controller 115) to perform, or at least initiate, a boot process that enables access, by the host system 120, to data stored on one or more of the memory devices 130, 140 of the memory sub-system 110. As noted herein, the access can include read-only or read-write access to the data. Where the boot process initially boots the memory sub-system 110 in read-only mode, the power backup manager component 113 can cause the memory sub-system 110 to switch from a read-only mode to a read-write mode upon receiving a signal from the power backup component 150. Depending on the embodiment, the signal can inform the memory sub-system controller 115 that either: each of the capacitor sets 160 satisfies a health condition; the number of capacitor sets failing to satisfy the health condition does not transgress a threshold number; or those capacitor sets in the capacitor sets 160 that pass the health condition are sufficiently charged (e.g., charged to a desired charge level). Further details with regards to the operations of the power backup manager component 113 are described below.

Figure 2:
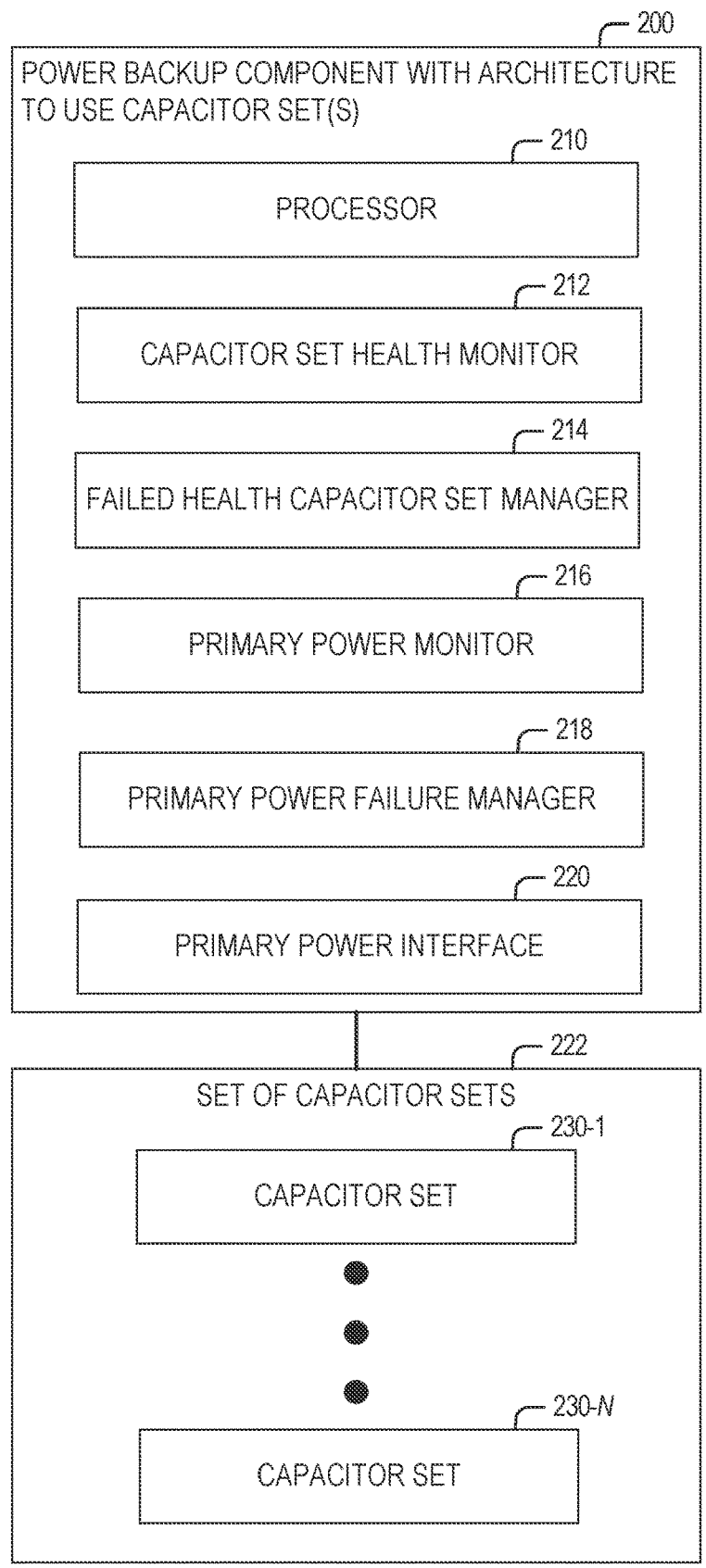
FIG. 2 is a block diagram of an example power backup component with architecture to use one or more capacitor sets, in accordance with some embodiments of the present disclosure.

FIG. 2 is a block diagram of an example power backup component 200 with architecture to use one or more capacitor sets, in accordance with some embodiments of the present disclosure. As shown, the power backup component 200 includes a processor 210, a capacitor set health monitor 212, a failed health capacitor set manager 214, a primary power monitor 216, a primary power failure manager 218, and a primary power interface 220. As also shown, the power backup component 200 is operatively coupled to a set of capacitor sets 222 (hereafter, the capacitor sets 222), which can include capacitor sets 230-1 to 230-N. For some embodiments, the power backup component 200 serves a memory sub-system (e.g., 110). Depending on the embodiment, the power backup component 200 can be part of or separate (e.g., external) from the memory sub-system. Additionally, the capacitor sets 222 used by the power backup component 200 can be part of or separate (e.g., external) from the memory sub-system.

According to some embodiments, the processor 210 includes a processing device that performs at least one of the operations described herein with respect to a power backup component. Depending on the embodiment, the processor 210 can perform one or more operations with respect to the capacitor sets 222 (e.g., charge, discharge, test individual capacitor sets) and can control one or more operations of the power backup component 200 (e.g., switching power provided to the memory sub-system, by the power backup component 200, from power received via the primary power interface 220 to power from the capacitor sets 222).

For some embodiments, the capacitor set health monitor 212 determines (e.g., periodically) whether an individual capacitor set 230-N, in the capacitor sets 222, satisfies a health condition and, in doing so, can check the health of the individual capacitor set 230-N. As described herein, for some embodiments, the capacitor set health monitor 212 performs this determination after a memory sub-system has completed a boot process. In particular, the capacitor set health monitor 212 can determine whether a boot process for a memory sub-system has completed and then determine whether an individual capacitor set 230-N, in the capacitor sets 222, satisfies a health condition. For instance, the capacitor set health monitor 212 can perform the determination after a memory sub-system controller (e.g., 115) instructs or signals the power backup component 200 to begin checking the health of the individual capacitor set 230-N. The capacitor set health monitor 212 can perform the determination by performing a test process on the individual capacitor set 230-N, where the test process includes, for example, loading a charge on the individual capacitor set 230-N (e.g., charge to a certain charge level), and then measuring how fast the individual capacitor set 230-N discharges (e.g., fast or steep discharge rate can indicate that the given capacitor set is unhealthy or unreliable for power backup purposes). Where capacitor set health monitor 212 performs the determination (e.g., test process) repeatedly (e.g., periodically) for individual capacitor sets of the capacitor sets 222, the results of the determination can be stored for future reference/comparison, thereby facilitating determination of whether the rate at which the discharge rate is changing over time (with repeated tests) indicates imminent failure of individual capacitor sets in the capacitor sets 222.

The failed health capacitor set manager 214 responds to one or more determinations made by the capacitor set health monitor 212 with respect to individual capacitor sets in the capacitor sets 222. For instance, depending on the embodiment, the failed health capacitor set manager 214 can respond to a determination (by the capacitor set health monitor 212) that at least one capacitor set of the capacitor sets 222 fails the health condition, or can respond to a determination (by the capacitor set health monitor 212) that a number of capacitor sets of the capacitor sets 222 that fail the health condition transgresses a threshold number (e.g., respond if the number of capacitor sets failing to satisfy the health condition surpasses the threshold number).

With respect to responses, the failed health capacitor set manager 214 can cause a memory sub-system (e.g., 110) to perform a data backup process (as described herein) in response to the capacitor set health monitor 212 determining that at least one capacitor set of the capacitor sets 222 fails to satisfy the health condition. Additionally, the failed health capacitor set manager 214 can cause a memory sub-system (e.g., 110) to switch to read-only mode (e.g., from read-write mode) in response to the capacitor set health monitor 212 determining that at least one capacitor set of the capacitor sets 222 fails to satisfy the health condition.

Alternatively, the failed health capacitor set manager 214 can cause a memory sub-system (e.g., 110) to perform a data backup process (as described herein) in response to the capacitor set health monitor 212 determining that a number of capacitor sets of the capacitor sets 222 that fail the health condition transgresses a threshold number. Additionally, the failed health capacitor set manager 214 can cause a memory sub-system (e.g., 110) to switch to read-only mode (e.g., from read-write mode) in response to the capacitor set health monitor 212 determining that a number of capacitor sets of the capacitor sets 222 that fail the health condition transgresses a threshold number.

The primary power monitor 216 determines (e.g., periodically) whether the power backup component 200 starts or stops receiving power from an external power source (e.g., the host system 120) via the primary power interface 220. For instance, as described herein, the power received via the primary power interface 220 can include power received by a memory sub-system (e.g., 110), such as from a host system (e.g., 120).

The primary power failure manager 218 responds to the determination by the primary power monitor 216. For some embodiments, the primary power failure manager 218 responds to a determination, by the primary power monitor 216, that the primary power interface 220 has stopped receiving primary power, by causing the power provided to the memory sub-system (e.g., 110) to switch from power provided by the primary power interface 220 to power provided by the capacitor sets 222.

The primary power interface 220 receives power from a power source external to the power backup component 200. For example, where the power backup component 200 is part of a memory sub-system (e.g., 110), the primary power interface 220 can receive power via a physical interface of the memory sub-system. For instance, power received by the physical interface of the memory sub-system can be provided by a host system (e.g., 120), such as by a power supply unit of the host system. Through the primary power interface 220, the power backup component 200 can monitor for primary power loss, which can result in the power backup component 200 providing an electronic system (e.g., memory sub-system) from the capacitor sets 222 instead of the power received from the primary power interface 220.

For some embodiments, each capacitor set 230-N can include one or more capacitors, and each of those capacitors can include a high-voltage capacitor suitable for providing backup power to an electronic system. As described herein, a given capacitor set 230-N can include two or more capacitors arranged in parallel, in series, or some combination thereof.

Figure 3:
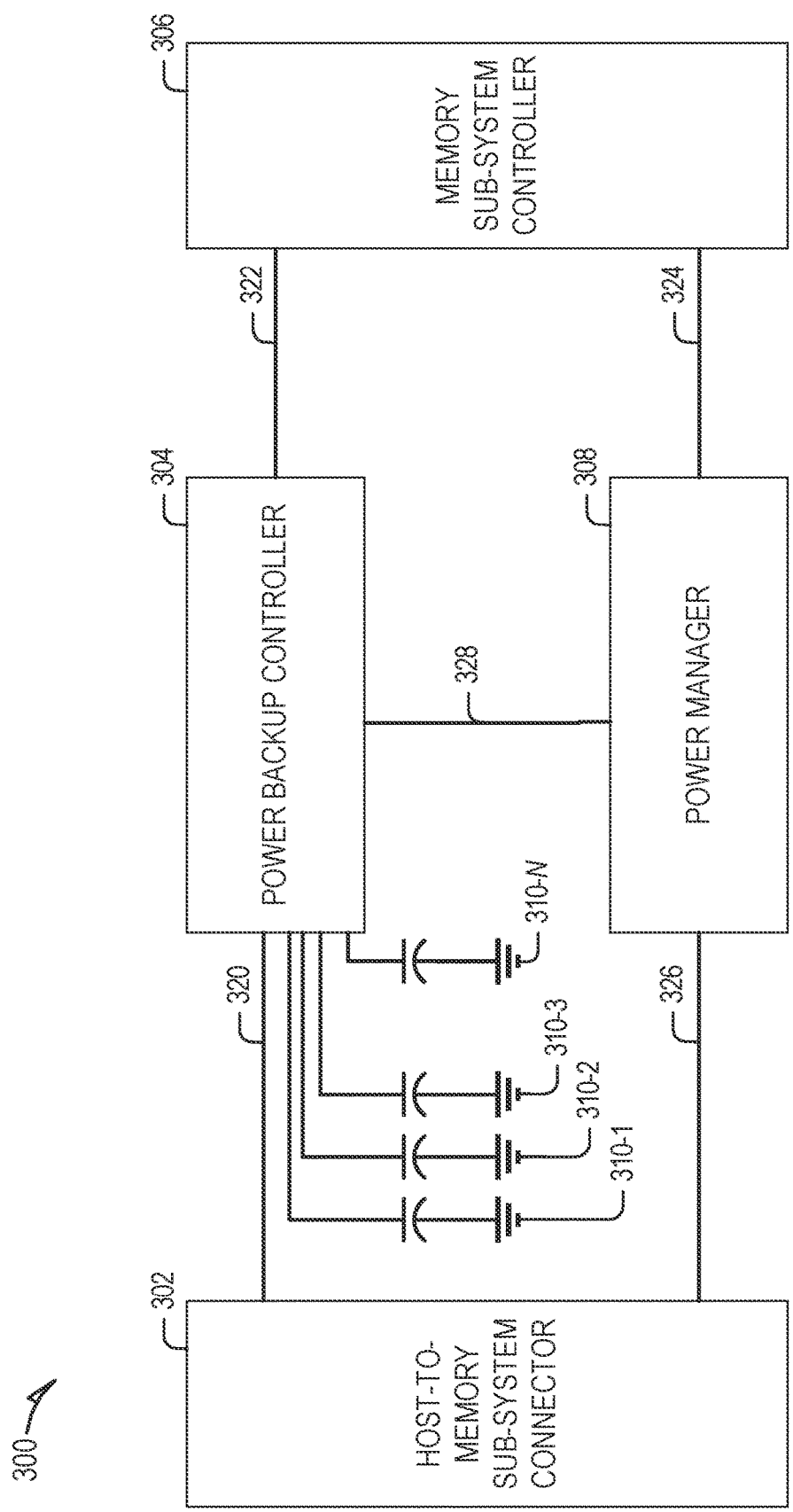
FIG. 3 is a diagram of an example power backup architecture implemented with respect to a memory sub-system, in accordance with some embodiments of the present disclosure.

FIG. 3 is a diagram of an example power backup architecture 300 implemented with respect to a memory subsystem, in accordance with some embodiments of the present disclosure. In particular, the power backup architecture 300 includes a host-to-memory-sub-system connector 302, a power backup controller 304, a memory sub-system controller 306, a power manager 308, and a set of capacitor sets 310-1 to 310-N. For some embodiments, the power backup controller 304 includes the power backup component 200 described herein with respect to FIG. 2. For some embodiments, the power manager 308 includes a power management integrated circuit (IC). Additionally, for some embodiments, the memory sub-system controller 306 includes the memory sub-system controller 115 described above with respect to FIG. 1.

The host-to-memory-sub-system connector 302 can include one or more hardware interfaces that permit a memory sub-system to operatively couple to a host system, thereby facilitating data operations between the memory sub-system and the host system. Coupling 320 operatively couples the host-to-memory-sub-system connector 302 to the power backup controller 304, and coupling 326 operatively couples the host-to-memory-sub-system connector 302 to the power manager 308. The coupling 320 can include a host power connection, thereby providing the power backup controller 304 with primary power provided to the memory sub-system system (by a host system) via the host-to-memory-sub-system connector 302. The coupling 326 can include one or more input/output (I/O) connections (e.g., general purpose input output (GPIO), I2C).

As shown, coupling 328 operatively couples the power backup controller 304 and the power manager 308. The coupling 328 can include one or more I/O connections (e.g., GPIO, I2C), a power connection that permits the power backup controller 304 to provide power to the power manager 308, and a connection for the power backup controller 304 to signal the power manager 308 that there is a loss of power from the host system.

As illustrated, coupling 322 operatively couples the power backup controller 304 and the memory sub-system controller 306. The coupling 322 can include: a connection for the memory sub-system controller 306 to signal the power backup controller 304 that the memory sub-system has completed a boot process and the power backup controller 304 initiate health checks on the set of capacitor sets 310-1 to 310-N and can charge them accordingly; a connection for the power backup controller 304 to signal the memory sub-system controller 306 that the memory sub-system controller 306 can switch to read-write mode (e.g., switch from read-only mode to read-write mode after the set of capacitor sets 310-1 to 310-N are sufficiently charged); one or more I/O connections GPIO, I2C); and a connection for the power backup controller 304 to signal the memory sub-system controller 306 that there is a loss of power from the host system. Coupling 324 operatively couples the memory sub-system controller 306 and the power manager 308. The coupling 324 can include one or more I/O connections (e.g., GPIO, I2C).

As shown, the power backup controller 304 is coupled to the set of capacitor sets 310-1 to 310-N, where each capacitor set 310 can be coupled to a separate pin of the power backup controller 304. Through a given pin coupled to a given capacitor set 310, the power backup controller 304 can charge, discharge, or test the given capacitor set 310.

During operation, once power to the memory sub-system via the host-to-memory-sub-system connector 302 is received, the memory sub-system controller 306 can power-up and initiate a boot process that enables the memory sub-system to be accessed by a host system via the host-to-memory-sub-system connector 302. The power backup controller 304 can determine when the boot process has completed (e.g., via a signal from the memory sub-system controller 306 to the power backup controller 304 indicating completion of the boot process). Upon determining that the boot process has completed, the power backup controller 304 can run health checks (e.g., based on a health condition) on each of the capacitor sets 310-1 to 310-N. For some embodiments, if the health checks on each of the capacitor sets 310-1 to 310-N passes (or the number of capacitor sets that fail the health check does not transgress a threshold number), each of the capacitor sets 310-1 to 310-N that passes its health check is charged (e.g., to a predetermined charge level) and a signal can be passed to the memory sub-system controller 306 to indicate when the charging process is complete. If one or more of the capacitor sets 310-1 to 310-N fails their respective health check, those capacitor sets can be isolated and the remaining of the capacitor sets 310-1 to 310-N are charged and a signal can be passed to the memory sub-system controller 306 that a failure of at least one capacitor set has occurred.

As noted herein, based on a boot process, the memory sub-system controller 306 can initially power-up (e.g., boot) such that the memory sub-system is in read-only mode. For some embodiments, the memory sub-system can remain in read-only mode until the power backup controller 304 signals to the memory sub-system controller 306 that either each of the capacitor sets 310 has passed its health check and is charged, or that the number of capacitor sets that fail the health check does not transgress a threshold number and each of the capacitor sets that do not fail the health check are charged. In the event of a power loss to the memory sub-system (power via the host-to-memory-sub-system connector 302), the host-to-memory-sub-system connector 302 can be isolated from the drive and the power backup controller 304 can switch power over to one or more of the capacitor sets 310-1 to 310-N (e.g., those capacitor sets 310-1 to 310-N that are charged).

Figure 4:
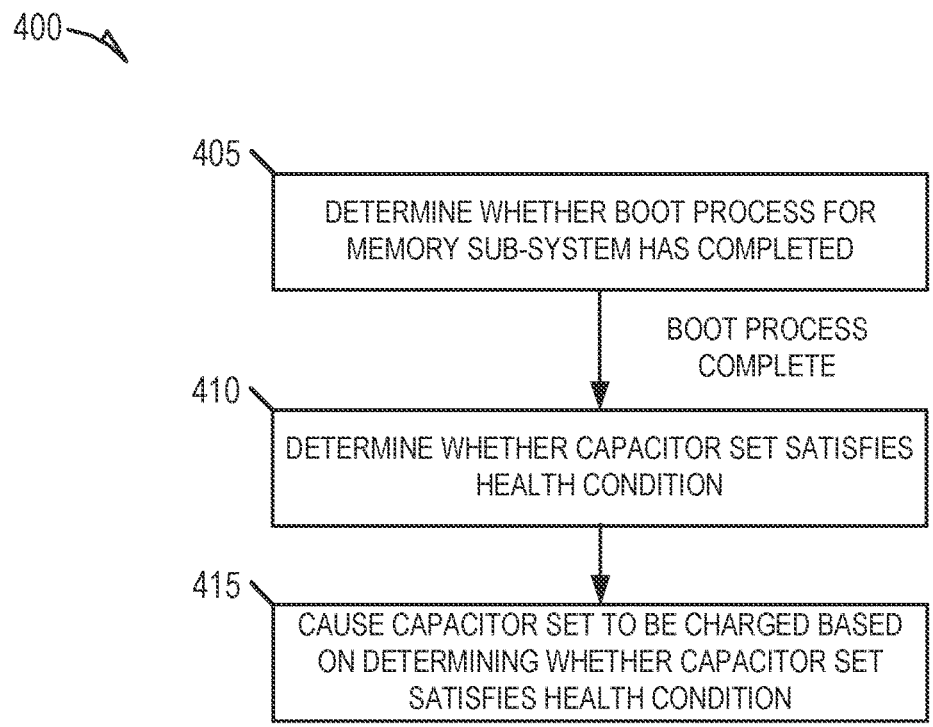
FIGS. 4 and 5 are flow diagrams of example methods to use a capacitor set in a power backup architecture, in accordance with some embodiments of the present disclosure.
Figure 5:
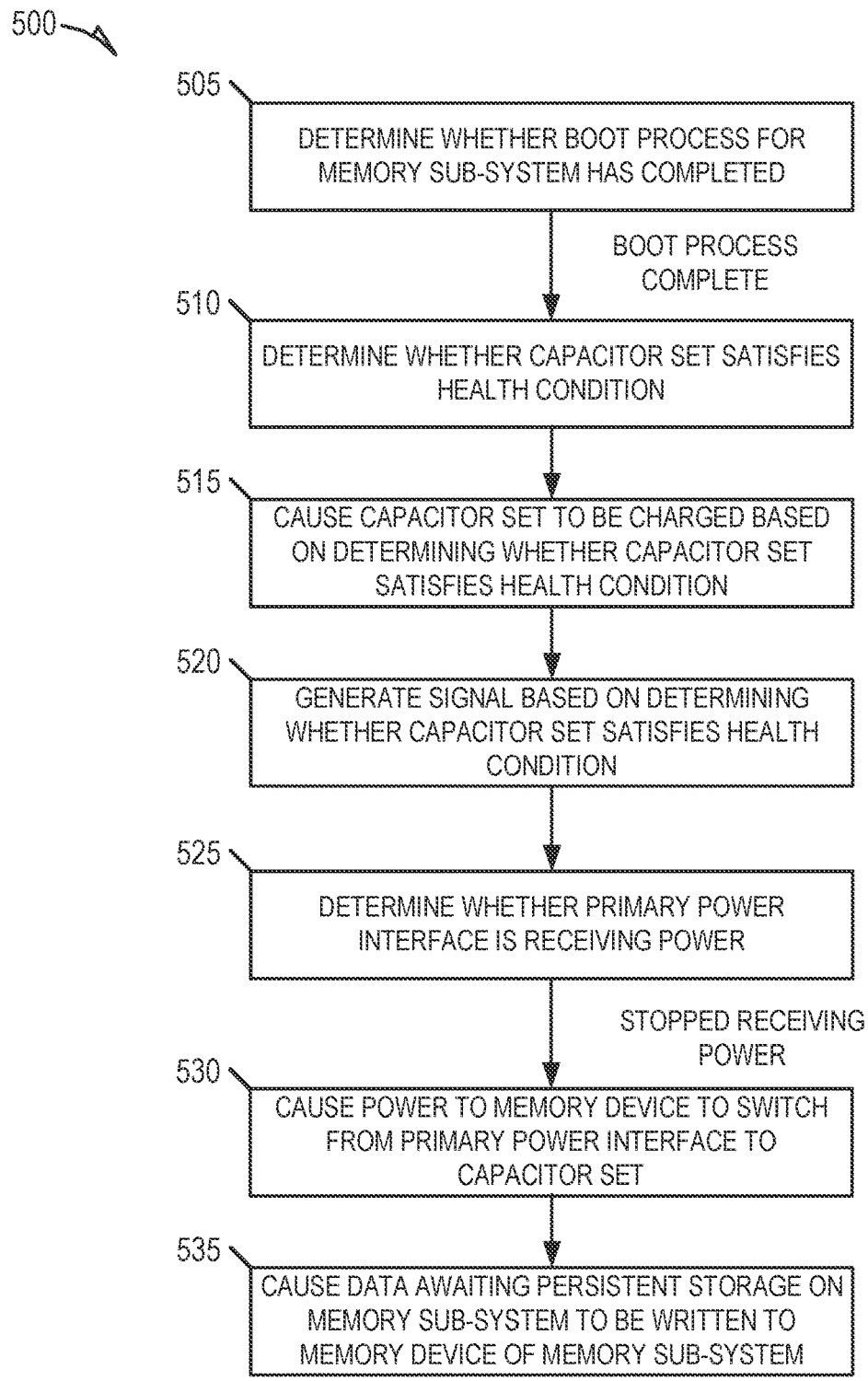

FIGS. 4 and 5 are flow diagrams of example methods to use a capacitor set in a power backup architecture, in accordance with some embodiments of the present disclosure. The methods 400, 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the power backup component 150 of FIG. 1. Additionally, or alternatively, for some embodiments, the method 400 is performed, at least in part, by the memory sub-system controller 115 (e.g., the processor of the memory sub-system controller 115) based on the power backup manager component 113. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring now to the method 400 of FIG. 4, at operation 405, a processing device (e.g., of the power backup component 150) determines whether a boot process for a memory sub-system 110) has completed, where the boot process enables access (e.g., read-only or read-write access) by a host system to a memory device (e.g., 130) of the memory sub-system. In doing so, the boot process can enable the host system to access data stored on the memory device prior to any of the capacitor sets, which form backup power for the memory sub-system, being checked for a health condition and charged, as described herein. The boot process can be at least initiated, if not performed at least in part, by a memory sub-system controller (e.g., 115) of the memory sub-system (e.g., 110).

In response to determining that the boot process for the memory sub-system has completed, at operation 410, the processing device determines whether at least one capacitor set, of a set of capacitor sets (e.g., 160) of the memory sub-system, satisfies a health condition. For some embodiments, this determination is performed for each capacitor set of the set of capacitor sets, and this determination is performed with two or more individual capacitor sets in parallel.

At operation 415, the processing device causes the at least one capacitor set (e.g., of 160) to be charged based on the determination performed at operation 410. For instance, in response to determining that each capacitor set in the set of capacitor sets has satisfied the health condition at operation 410, the processing device can cause all of the set of capacitor sets to charge. In response to determining that at least one capacitor set in the set of capacitor sets fails to satisfy the health condition at operation 410, the processing device can cause each capacitor set that satisfies the health condition to charge. Those capacitor sets that fail to satisfy the health condition can be isolated and prevented from charging.

Referring now to the method 500 of FIG. 5, the method 500 begins with operations 505 to 515, which according to some embodiments, are respectively similar to operations 405 to 415 described above with respect to the method 400 of FIG. 4.

At operation 520, the processing device (e.g., of the component 200) generates a signal (e.g., from the power backup component 200 to the memory sub-system controller 115) based on the determination performed at operation 510. Depending on the embodiment, the signal can indicate the failure of capacitor set to satisfy the health condition, indicate that the number of capacitor sets failing to satisfy the health condition has transgressed a threshold number, or indicate that the number of capacitor sets failing to satisfy the health condition has not transgressed the threshold number. Where the boot process of operation 505 causes the memory sub-system to initially power-up in read-only mode, in response to determining that at least one capacitor set fails to satisfy the health condition (or in response to a number of capacitor sets failing to satisfy the health condition transgressing a threshold number), the processing device can refrain from generating a signal, which in turn can cause the memory sub-system (or at least a memory component thereof) to remain in read-only mode. Alternatively, in response to determining that each of the capacitor sets satisfy the health condition (or in response to a number of capacitor sets failing to satisfy the health condition not transgressing a threshold number), the processing device can generate a signal that causes the memory sub-system (or at least a memory device thereof) to switch from read-only mode to read-write mode. This signal can be generated after operation 515 has successfully charged each capacitor set that has satisfied the health condition. Further, at operation 520, in response to determining that at least one capacitor set fails to satisfy the health condition (or in response to a number of capacitor sets failing to satisfy the health condition transgressing a threshold number), the process device can generate a signal that causes data that is awaiting persistent storage on the memory sub-system to be written to at least one memory device (e.g., via a data backup process performed on the memory sub-system).

At operation 525, the processing device determines whether a primary power interface of the memory sub-system (e.g., 110) is receiving power from a power source external to the memory sub-system (e.g., power supply unit of the host system 120). As described herein, the primary power interface can be part of a host-to-memory-sub-system connector (e.g., 302) that can operatively couple to a host system (e.g., 120).

In response determining that primary power interface has stopped receiving power from the power source external to the memory sub-system, at operation 530, the processing device causes power to at least a memory device of the memory sub-system (if not also the memory sub-system controller) to switch from the primary power interface to one or more capacitor sets of the set of capacitor sets (e.g., the capacitor sets that satisfy the health condition and that are charged, thereby rendering them ready for power backup use).

Additionally, in response determining that primary power interface has stopped receiving power from the power source external to the memory sub-system, at operation 535, the processing device causes data that is awaiting persistent storage on the memory sub-system (e.g., data "in-flight" from the host system to the memory sub-system) to be written to a memory device (e.g., 130) of the memory sub-system.

Figure 6A:
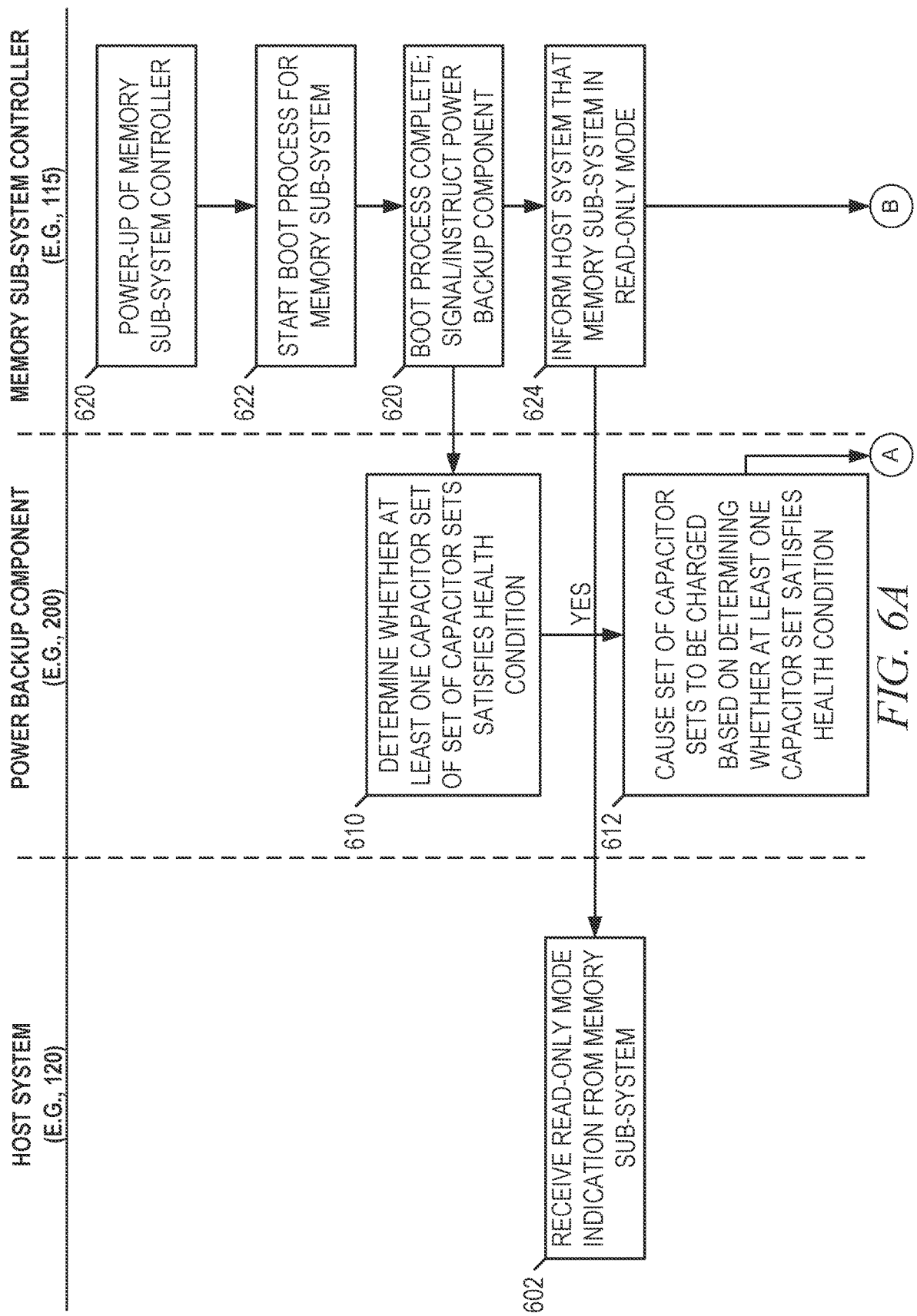
FIGS. 6A through 6C provide an interaction diagram illustrating interactions between components of the computing environment in the context of some embodiments in which a method for using a capacitor set in a power backup architecture is performed.
Figure 6B:
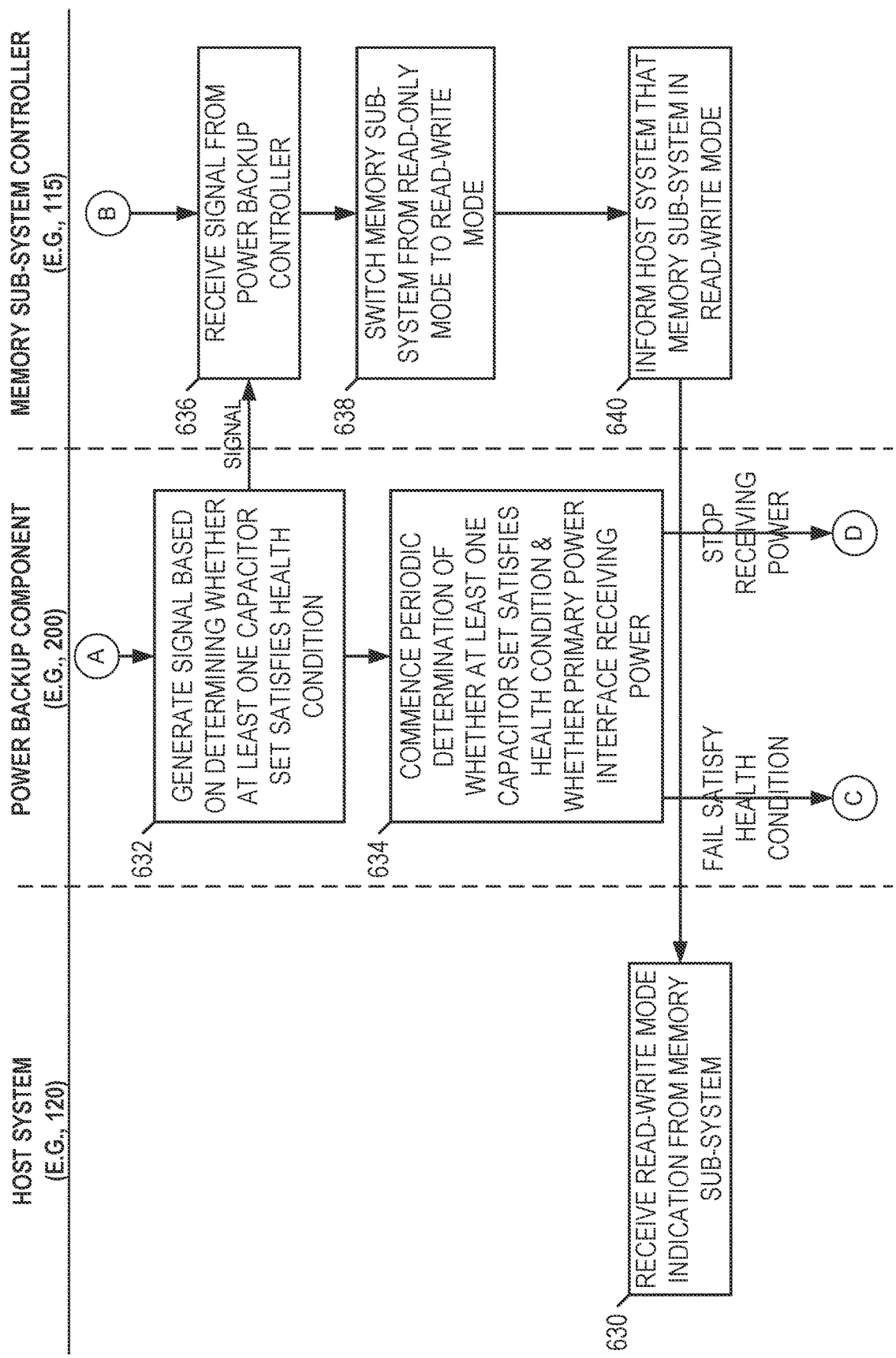
Figure 6C:
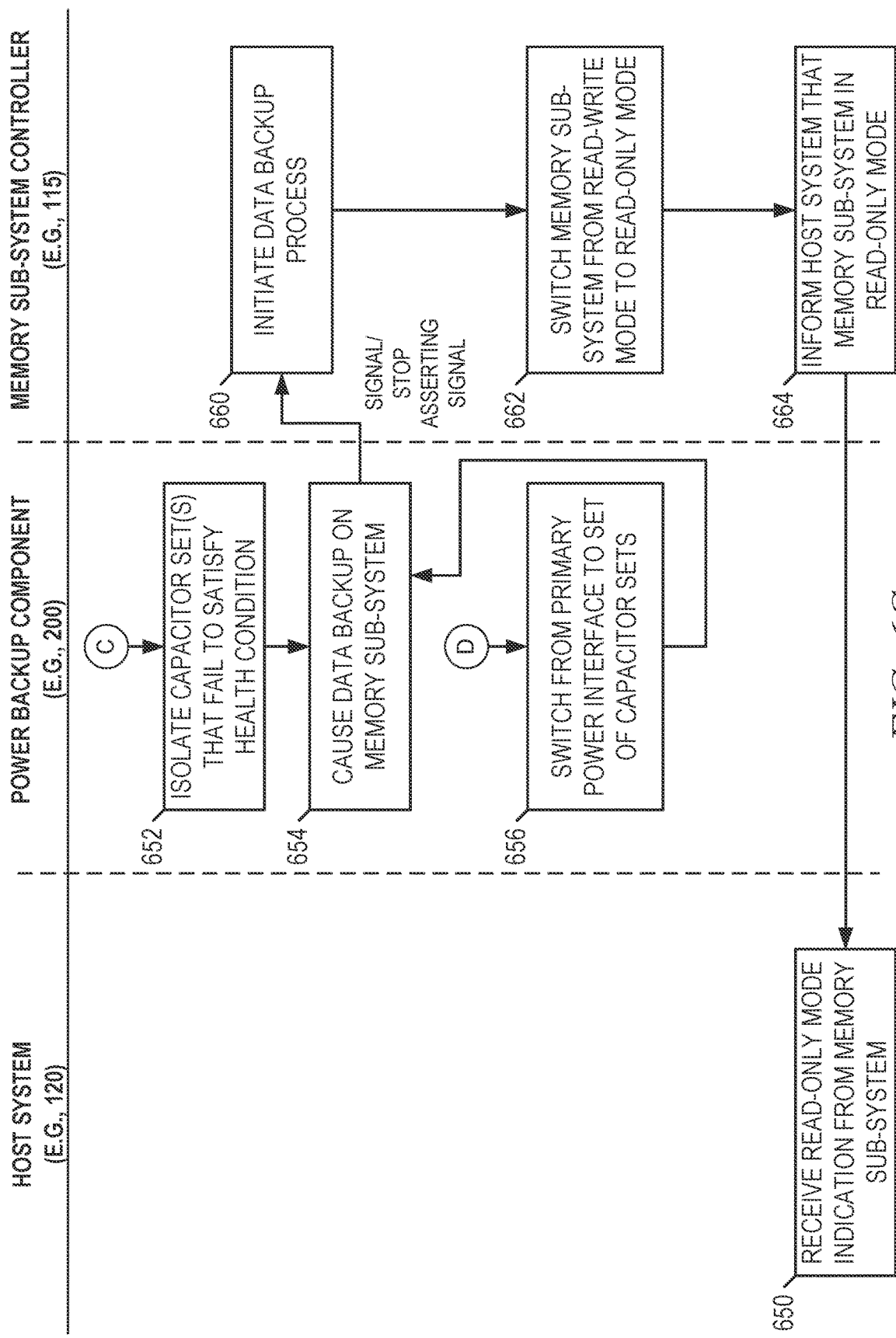

FIGS. 6A through 6C provide an interaction diagram illustrating interactions between components of the computing environment 100 in the context of some embodiments in which a method for using a capacitor set in a power backup architecture is performed. The operations of the method can be performed by processing logic that can include hardware (e.g., a processing device, circuitry, dedicated logic, programmable logic, microcode, hardware of a device, an integrated circuit, etc. software (e.g., instructions run or executed on a processing device), or a combination thereof. In some embodiments, the method is performed by a host system (e.g., 120), a power backup component (e.g., 200), a memory sub-system controller (e.g., 115), or a combination. Although the operations are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. In the context of the example illustrated in FIG. 6, the host system can include the host system 120, the power backup component can include the power backup component 200, and the memory sub-system controller can include the memory sub-system controller 115.

As shown in FIG. 6, at operation 620, the memory sub-system controller 115 power-ups and, at operation 622, starts a boot process for the memory sub-system (e.g., 110) that enables data stored on a memory device (e.g., 130) of the memory sub-system to be accessed by a host system (e.g., 120). At operation 620, after the hoot process is complete, the memory sub-system controller 115 can signal or instruct the power backup component 200 to begin its health check of at least one capacitor set in the set of capacitor sets (e.g., 160). Additionally, after the boot process is complete, at operation 624, the memory sub-system controller 115 informs the host system 120 that the memory sub-system is in read-only mode (which the host system 120 receives at operation 602).

Accordingly, at operation 610, the power backup component 200 determines whether at least one capacitor set (e.g., each capacitor set) of the set of capacitor sets (e.g., 160) satisfies a health condition. At operation 612, the power backup component 200 causes the set of capacitor sets to be charged based on the determination at operation 610. Additionally, at operation 632, the power backup component 200 generates a signal based on the determination at operation 610. At operation 636, the memory sub-system controller 115 receives the signal from the power backup component 200 and, in response, switches the memory sub-system from read-only mode to read-write mode at operation 638. Subsequently, at operation 640, the memory sub-system controller 115 informs the host system 120 that the memory sub-system is in read-write mode. At operation 630, the host system 120 receives an indication that the memory sub-system is in read-write mode.

At operation 634, the power backup component 200 commences periodic determination of whether at least one capacitor set (e.g., each capacitor set) of the set of capacitor sets (e.g., 160) satisfies the health condition, and periodic determination of whether the primary power interface is receiving power. In response to determining that at least one capacitor set fails to satisfy the health condition (or in response to a number of capacitor sets failing to satisfy the health condition transgressing a threshold number) at operation 634, the power backup component 200 isolates one or more of the capacitor sets that fail to satisfy the health condition at operation 652. Additionally, at operation 654, the power backup component 200 causes a data backup process to be performed on the memory sub-system. Depending on the embodiment, the power backup component 200 can perform operation 654 by generating a signal to the memory sub-system controller 115 that indicates failure of at least one capacitor set (or the number of capacitor sets failing to satisfy the health condition transgressing a threshold number). Alternatively, the power backup component 200 can perform operation 654 by stopping assertion of the signal received by the memory sub-system controller 115 at operation 636.

In response to determining that the memory sub-system stops receiving power (e.g., from the host system 120), the power backup component 200 switches power for the memory sub-system from power provided by the primary power interface to power provided by the set of capacitor sets at operation 656. After operation 656, operation 654 can be performed by power backup component 200.

In response to operation 654, the memory sub-system 115 initiates a data backup process on the memory sub-system at operation 660 and, subsequently, switches the memory sub-system from read-write mode to read-only mode. At operation 664, the memory sub-system controller 115 informs the host system 120 that the memory sub-system is in read-only mode. At operation 650, the host system 120 receives an indication that the memory sub-system is in read-only mode.

Figure 7:
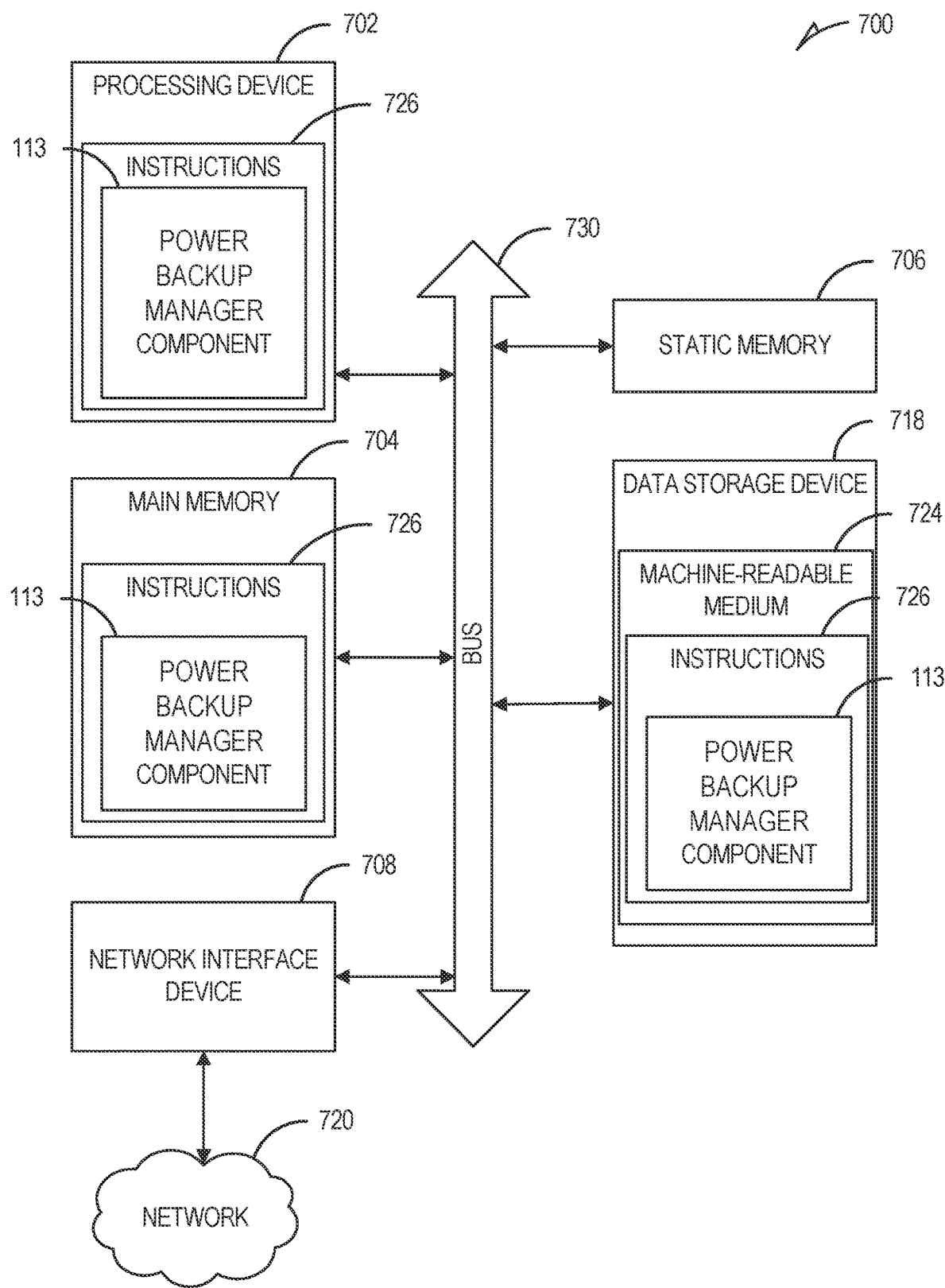
FIG. 7 is a block diagram of an example computer system in which embodiments of the present disclosure may operate.

FIG. 7 illustrates an example machine in the form of a computer system 700 within which a set of instructions can be executed for causing the machine to perform any one or more of the methodologies discussed herein. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the power backup manager component 113 of FIG. 1). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the terra "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage device 718, which communicate with each other via a bus 730.

The processing device 702 represents one or more general-purpose processing devices such as a microprocessor, a central processing unit, or the like. More particularly, the processing device 702 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 702 can also be one or more special-purpose processing devices such as an application specific integrated circuit (ASIC), a field programmable gate array (FPGA), a digital signal processor (DSP), a network processor, or the like. The processing device 702 is configured to execute instructions 726 for performing the operations and steps discussed herein. The computer system 700 can further include a network interface device 708 to communicate over a network 720.

The data storage device 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage device 718, and/or main memory 704 can correspond to the memory sub-system 110 of FIG. 1.

In one embodiment, the instructions 726 include instructions to implement functionality corresponding to using a capacitor set in a power backup architecture as described herein (e.g., the power backup manager component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

EXAMPLES

Example 1 is a system comprising: a memory device; a capacitor set; and a processing device, coupled to the memory device and the capacitor set, the processing device configured to perform operations comprising: determining whether a boot process has completed, the boot process enabling access by a host system to the memory device; and in response to determining that the boot process has completed: determining whether the capacitor set satisfies a health condition; and causing the capacitor set to be charged based on the determining whether the capacitor set satisfies the health condition.

In Example 2, the subject matter of Example 1 optionally includes where the operations further comprise: generating a signal based on the determining whether the capacitor set satisfies the health condition.

In Example 3, the subject matter of Example 1 or Example 2 optionally includes where the signal causes the system to switch from a read-only mode to a read-write mode.

In Example 4, the subject matter of any one of Examples 1 to 3 optionally includes where the generating the signal based on the determining whether the capacitor set satisfies the health condition comprises: in response to determining that the capacitor set in the capacitor set fails to satisfy the health condition, generating the signal to indicate that the capacitor set has failed to satisfy the health condition.

In Example 5, the subject matter of any one of Examples 1 to 4 optionally includes where the operations further comprise: in response to the signal indicating that the capacitor set has failed to satisfy the health condition, causing data that is awaiting persistent storage to be written to the memory device.

In Example 6, the subject matter of any one of Examples 1 to 5 optionally includes where the operations further comprise: in response to the signal indicating that the capacitor set has failed to satisfy the health condition, causing the memory device to switch to read-only mode.

In Example 7, the subject matter of any one of Examples 1 to 6 optionally includes where the causing the capacitor set to be charged based on the determining whether the capacitor set satisfies the health condition comprises: in response to determining that each capacitor set in the capacitor set has satisfied the health condition, causing the capacitor set to charge.

In Example 8, the subject matter of any one of Examples 1 to 7 optionally includes where the causing the capacitor set to be charged based on the determining whether the capacitor set satisfies the health condition further comprises: after the capacitor set has satisfied a charge condition, causing a memory sub-system to switch from read-only mode to read-write mode.

In Example 9, the subject matter of any one of Examples 1 to 8 optionally includes where the system further comprises: a plurality of capacitor sets, the plurality of capacitor sets comprising the capacitor set.

In Example 10, the subject matter of any one of Examples 1 to 9 optionally includes where the causing the capacitor set to be charged based on the determining whether the capacitor set satisfies the health condition comprises: in response to determining that at least one capacitor set in the plurality of capacitor sets fails to satisfy the health condition, causing a capacitor set in the plurality of capacitor sets that satisfies the health condition to charge.

In Example 11, the subject matter of any one of Examples 1 to 10 optionally includes where the operations further comprise: in response to determining that a number of capacitor sets in the plurality of capacitor sets that fail to satisfy the health condition does not transgress a threshold number of capacitor sets, generating a signal to indicate that a sufficient number of capacitor sets in the plurality of capacitor sets has satisfied the health condition, the threshold number being less than all capacitor sets in the plurality of capacitor sets.

In Example 12, the subject matter of any one of Examples 1 to 11 optionally includes where the causing the plurality of capacitor sets to be charged based on the determining whether the capacitor set satisfies the health condition comprises: in response to determining that a number of capacitor sets in the plurality of capacitor sets that fail to satisfy the health condition does not transgress a threshold number of capacitor sets, causing each particular capacitor set in the plurality of capacitor sets that satisfies the health condition to charge, the threshold number being less than all capacitor sets in the plurality of capacitor sets.

In Example 13, the subject matter of any one of Examples 1 to 12 optionally includes where the operations further comprise: after each particular capacitor has satisfied a charge condition, generating a signal indicating that the number of capacitor sets in the plurality of capacitor sets that fail to satisfy the health condition does not transgress the threshold number of capacitor sets.

In Example 14, the subject matter of any one of Examples 1 to 13 optionally includes where the operations further comprise: determining whether a primary power interface of a memory sub-system is receiving power from an external power source; and in response to determining that the primary power interface has stopped receiving power from the external power source: causing power to the memory device to switch from the primary power interface to the capacitor set; and causing data that is awaiting persistent storage to be written to the memory device.

In Example 15, the subject matter of any one of Examples 1 to 14 optionally includes where the system further comprises: a power backup controller, the power backup controller being separate from a memory sub-system controller that manages the memory device, the power backup controller comprising the processing device.

In Example 16, the subject matter of any one of Examples 1 to 15 optionally includes where the system further comprises: a memory sub-system controller operatively coupled to the memory device to manage the memory device.

Example 17 is a method comprising causing, by a memory sub-system controller of a memory sub-system, a boot process to start for the memory sub-system, the boot process enabling access by a host system to a memory device of the memory sub-system; determining, at a power backup controller, whether the boot process has completed for the memory sub-system; and in response to determining that the boot process has completed: determining, by the power backup controller, whether a capacitor set satisfies a health condition, the capacitor set to provide backup power to the memory sub-system in response to the memory sub-system losing primary power; and causing, by the power backup controller, the capacitor set to be charged based on the determining whether the capacitor set satisfies the health condition.

In Example 18, the subject matter of Example 17 optionally includes where the determining, at the power backup controller, whether the boot process has completed for the memory sub-system comprises: determining, at the power backup controller, whether the power backup controller has received at least one of: a signal from the memory sub-system controller indicating completion of the boot process; or an instruction from the memory sub-system controller that instructs the power backup controller to perform a capacitor health check.

Example 19 is a non-transitory machine-readable storage medium comprising instructions that, when executed by a processing device, cause the processing device to perform operations comprising: receiving an instruction, from a memory sub-system controller of a memory sub-system, to perform a capacitor health check, the instruction being received after a boot process for the memory sub-system has completed; and in response to receiving the instruction from the memory sub-system controller: determining whether a capacitor set satisfies a health condition, the capacitor set to provide backup power to the memory sub-system in response to the memory sub-system losing primary power; and causing the capacitor set to be charged based on the determining whether the capacitor set satisfies the health condition.

In Example 20, the subject matter of Example 19 optionally includes where the causing the capacitor set to be charged based on the determining whether the capacitor set satisfies the health condition comprises: in response to determining that each capacitor set in the capacitor set has satisfied the health condition, causing the capacitor set to charge.

What is claimed is:
1. A system comprising:
a memory device;
a capacitor set; and
a processing device, coupled to the memory device and the capacitor set, the processing device configured to perform operations comprising:
determining whether a boot process has completed, the boot process starting the memory device in read-only mode and enabling access by a host system to the memory device; and
in response to determining that the boot process has completed:
determining whether the capacitor set satisfies a health condition; and
generating a signal based on the determining of whether the capacitor set satisfies the health condition;
the system being configured to switch the memory device from the read-only mode to a read-write mode in response to the signal indicating that the capacitor set satisfies the health condition.

2. The system of claim 1, wherein the signal is sent to a memory sub-system controller of the system that is operatively coupled to the memory device to manage the memory device.

3. The system of claim 2, comprising:
a power backup controller that is separate from the memory sub-system controller, the power backup controller comprising the processing device.

4. The system of claim 1, wherein the system is configured to cause data that is awaiting persistent storage to be written to the memory device in response to the signal indicating that the capacitor set has failed to satisfy the health condition.

5. The system of claim 1, wherein the system is configured to leave the memory device in the read-only mode in response to the signal indicating that the capacitor set has failed to satisfy the health condition.

6. The system of claim 1, comprising:
a plurality of capacitor sets, the plurality of capacitor sets comprising the capacitor set.

7. The system of claim 6, wherein the determining of whether the capacitor set satisfies the health condition comprises determining whether each individual capacitor set in the plurality of capacitor sets has satisfied the health condition, and wherein the operations comprise:
in response to determining that each individual capacitor set in the plurality of capacitor sets has satisfied the health condition, causing the plurality of capacitor sets to charge.

8. The system of claim 6, wherein the determining of whether the capacitor set satisfies the health condition comprises determining whether each individual capacitor set in the plurality of capacitor sets has satisfied the health condition, and wherein the operations comprise:
in response to the signal indicating that at least one capacitor set in the plurality of capacitor sets fails to satisfy the health condition, causing at least one other capacitor set in the plurality of capacitor sets that satisfies the health condition to charge.

9. The system of claim 6, wherein the determining of whether the capacitor set satisfies the health condition comprises determining whether a number of capacitor sets in the plurality of capacitor sets that fail to satisfy the health condition transgresses a threshold number of capacitor sets.

10. The system of claim 1, wherein the system is configured to switch the memory device from the read-only mode to the read-write mode, in response to the signal indicating that the capacitor set satisfies the health condition, after the capacitor set has satisfied a charge condition.

11. The system of claim 1, wherein the operations comprise:
determining whether a primary power interface of a memory sub-system is receiving power from an external power source; and
in response to determining that the primary power interface has stopped receiving power from the external power source:
causing power to the memory device to switch from the primary power interface to the capacitor set; and
causing data that is awaiting persistent storage to be written to the memory device.

12. A method comprising:
causing, by a memory sub-system controller of a memory sub-system, a boot process to start for the memory sub-system, the boot process starting a memory device of the memory sub-system in read-only mode and enabling access by a host system to the memory device;
determining, at a power backup controller, whether a boot process has completed; and
in response to determining that the boot process has completed:
determining, by the power backup controller, whether a capacitor set satisfies a health condition, the capacitor set to provide backup power to the memory sub-system in response to the memory sub-system losing primary power; and
generating, by the power backup controller, a signal based on the determining of whether the capacitor set satisfies the health condition; the memory sub-system controller being configured to switch the memory device from the read-only mode to a read-write mode in response to the signal indicating that the capacitor set satisfies the health condition.

13. The method of claim 12, wherein the signal is a first signal, and wherein the determining, at the power backup controller, of whether the boot process has completed for the memory sub-system comprises:
determining, at the power backup controller, whether the power backup controller has received at least one of:
a second signal from the memory sub-system controller indicating completion of the boot process; or
an instruction from the memory sub-system controller that instructs the power backup controller to perform a capacitor health check.

14. The method of claim 12, wherein the memory sub-system controller is configured to cause data that is awaiting persistent storage to be written to the memory device in response to the signal indicating that the capacitor set has failed to satisfy the health condition.

15. The method of claim 12, wherein the memory sub-system controller is configured to leave the memory device in the read-only mode in response to the signal indicating that the capacitor set has failed to satisfy the health condition.

16. The method of claim 12, wherein the memory sub-system comprises a plurality of capacitor sets, wherein the plurality of capacitor sets comprises the capacitor set, wherein the determining of whether the capacitor set satisfies the health condition comprises determining whether each individual capacitor set in the plurality of capacitor sets has satisfied the health condition, and wherein the method comprises:
in response to determining that each individual capacitor set in the plurality of capacitor sets has satisfied the health condition, causing, by the power backup controller, the plurality of capacitor sets to charge.

17. The method of claim 12, wherein the memory sub-system controller is configured to switch the memory device from the read-only mode to the read-write mode, in response to the signal indicating that the capacitor set satisfies the health condition, after the capacitor set has satisfied a charge condition.

18. The method of claim 12, wherein the memory sub-system comprises a plurality of capacitor sets, wherein the determining of whether the capacitor set satisfies the health condition comprises determining whether each individual capacitor set in the plurality of capacitor sets has satisfied the health condition, and wherein the method comprises:
in response to the signal indicating that at least one capacitor set in the plurality of capacitor sets fails to satisfy the health condition, causing, by the power backup controller, at least one other capacitor set in the plurality of capacitor sets that satisfies the health condition to charge.

19. The method of claim 12, wherein the memory sub-system comprises a plurality of capacitor sets, and wherein the determining of whether the capacitor set satisfies the health condition comprises determining whether a number of capacitor sets in the plurality of capacitor sets that fail to satisfy the health condition transgresses a threshold number of capacitor sets.

20. A non-transitory machine-readable storage medium comprising instructions that, when executed by a processing device, cause the processing device to perform operations comprising:
- receiving an instruction, from a memory sub-system controller of a memory sub-system, to perform a capacitor health check, the instruction being received after a boot process for the memory sub-system has completed, the boot process starting a memory device of the memory sub-system in read-only mode and enabling access by a host system to the memory device; and
- in response to receiving the instruction from the memory sub-system controller:
- determining whether a capacitor set satisfies a health condition, the capacitor set to provide backup power to the memory sub-system in response to the memory sub-system losing primary power; and
- generating a signal based on the determining of whether the capacitor set satisfies the health condition, the memory sub-system controller being configured to switch the memory device from the read-only mode to a read-write mode in response to the signal indicating that the capacitor set satisfies the health condition.

\* \* \* \* \*